United States Patent
Chen

(10) Patent No.: US 11,264,535 B1
(45) Date of Patent: Mar. 1, 2022

(54) PIXEL DEVICE AND DISPLAY USING A MONOLITHIC BLUE/GREEN LED COMBINED WITH RED LUMINESCENCE MATERIALS

(71) Applicant: Jyh-Chia Chen, Los Angeles, CA (US)

(72) Inventor: Jyh-Chia Chen, Los Angeles, CA (US)

(*) Notice: Subject to any disclaimer, the term of this patent is extended or adjusted under 35 U.S.C. 154(b) by 28 days.

(21) Appl. No.: 16/991,952

(22) Filed: Aug. 12, 2020

(51) Int. Cl.
| H01L 33/06 | (2010.01) |
| H01L 33/32 | (2010.01) |
| H01L 33/12 | (2010.01) |
| H01L 33/36 | (2010.01) |
| H01L 33/08 | (2010.01) |

(52) U.S. Cl.
CPC .............. *H01L 33/06* (2013.01); *H01L 33/08* (2013.01); *H01L 33/12* (2013.01); *H01L 33/32* (2013.01); *H01L 33/36* (2013.01)

(58) Field of Classification Search
CPC ......... H01L 33/06; H01L 33/08; H01L 33/02; H01L 33/32; H01L 33/36; H01L 33/387
See application file for complete search history.

(56) References Cited

U.S. PATENT DOCUMENTS

| 8,355,418 | B2 | 1/2013 | Raring et al. |
| 8,575,592 | B2 * | 11/2013 | Bergmann .............. H01L 33/04 257/13 |
| 9,530,932 | B2 | 12/2016 | Fudeta et al. |
| 9,985,174 | B2 * | 5/2018 | El-Ghoroury ....... H01S 5/34333 |
| 9,997,663 | B2 | 6/2018 | Choi et al. |
| 10,246,742 | B2 | 4/2019 | Rothberg et al. |
| 10,396,240 | B2 * | 8/2019 | Yeh .......................... H01L 33/30 |
| 10,418,516 | B2 * | 9/2019 | El-Ghoroury ........... H01L 33/32 |
| 11,063,179 | B2 * | 7/2021 | El-Ghoroury ........... H01L 33/32 |
| 2006/0049415 | A1 * | 3/2006 | Liao ...................... B82Y 20/00 257/94 |
| 2016/0359299 | A1 * | 12/2016 | El-Ghoroury ....... H01S 5/34333 |
| 2017/0133826 | A1 | 5/2017 | Han |

* cited by examiner

*Primary Examiner* — Savitri Mulpuri
(74) *Attorney, Agent, or Firm* — Clement Cheng

(57) ABSTRACT

An LED has: a substrate formed as a substrate layer; a buffer layer formed on the substrate layer; and an N− doped layer formed on the buffer layer. A first dual color blue/green MQW active region, a negative electrode, and a second dual color blue/green MQW active region formed on the N− doped layer. A first P− doped layer is formed on the first dual color blue green MQW active region. A second P− doped layer is formed on the second dual color blue green MQW active region. A first P+ doped layer is formed on the first P− doped layer. A second P+ doped layer is formed on the second P− doped layer. A first positive electrode is formed on the first P+ doped layer. A second positive electrode is formed on the second P+ doped layer. A blue/green LED with red luminescence materials emits a full spectrum.

18 Claims, 6 Drawing Sheets

PIXEL DEVICE AND DISPLAY USING A MONOLITHIC BLUE/GREEN LED COMBINED WITH RED LUMINESCENCE MATERIALS

FIELD OF THE INVENTION

The present invention is in the field of LED panel display technology, more specifically RGB LED elements used as a full-color pixel in display or light component in a lighting system.

DISCUSSION OF RELATED ART

A variety of different pixel devices for light-emitting graphical displays have been discussed in the prior art. For example, in U.S. Pat. No. 8,355,418 entitled Growth Structures And Method For Forming Laser Diodes by inventor James W. RARING et al., published Jan. 15, 2013 the abstract discloses, "An optical device having a structured active region configured for one or more selected wavelengths of light emissions and formed on an off-cut m-plane gallium and nitrogen containing substrate."

Also for example, in United States publication number U.S. Pat. No. 9,530,932B2 entitled. Nitride Semiconductor Light-Emitting Device and Method For Producing the Same by inventor Mayuko Fudeta et al., published Sep. 12, 2019 the abstract discloses, "A nitride semiconductor light-emitting device has a first conductive-type nitride semiconductor layer, a superlattice layer provided on the first conductive-type nitride semiconductor layer, an active layer provided on the superlattice layer, and a second conductive-type nitride semiconductor layer provided on the active layer. An average carrier concentration of the superlattice layer is higher than an average carrier concentration of the active layer."

SUMMARY OF THE INVENTION

The present invention is a red green blue (RGB) light-emitting diode element (LED) which has a monolithic dual-color (blue and green) light emitting device divided into two sub-divisions where one of them is partially covered with red luminescence materials. The green and blue emissions are independently generated in a first sub-pixel by selecting different input currents. The red emission in the second sub-pixel is generated by the down-conversion of green and/or blue emissions generated in the second sub-pixel. As a result, the three primary colors (blue, green and red) can be individually Obtained from this single device. The single device with three terminals, namely one cathode and two anodes, can emit a full color spectrum of light through a mixture of three primary colors.

The emissions from this dual-color LED are wavelength tunable. Current pulse intensity, and pulse intensity width modulation (PIWM) provides individual color pixel color compensation. The color composition can be performed without powering off the device, Each individual color pixel has a current pulse intensity and pulse width color composition.

Red luminescence materials can be red quantum dots, red phosphors, rare-earth materials, or other red colored materials. The red luminescence materials can be in the form of particles, gels, film, or plates. The present invention device can emit three primary colors at a precise ratio to emulate natural sunlight at different times. Therefore, corrected-color-temperature (CCT) controllable white light LEDs can be achieved based on this single device.

Summary of the Claims

A light-emitting diode (LED) has: a substrate formed as a substrate layer, such as sapphire, Si, GaN, SiC. graphene or the like; a buffer layer formed on the substrate layer; and an N− doped layer formed on the buffer layer. A first dual color blue/green MQW active region, a negative electrode, and a second dual color blue/green MQW active region are formed on the N− doped layer. A first P− doped layer is formed on the first dual color blue/green MOW active region. A second P− doped layer is formed on the second dual color blue/green MOW active region. A first P+ doped layer is formed on the first P− doped layer. A second P+ doped layer is formed on the second P− doped layer. A first positive electrode is formed on the first P+ doped layer. A second positive electrode is formed on the second P+ doped layer.

A red luminescence layer is mounted over the second P+ doped layer. The first dual color blue/green MOW active region is configured to output a blue emission having a peak wavelength between 450 nm and 475 nm the first positive electrode has a large current flow, for example at 360 mA.

The first dual color blue green MQW active region is configured to output a green emission having a peak wavelength between 500 nm and 550 nm when the first positive electrode has a low current flow, for example at 40 mA. The first dual color blue/green MOW active region is formed of a laminated structure comprising a P-AlGaN electron blocking layer formed over a green emission layer, and the green emission layer is formed over a GaN barrier layer. The GaN barrier layer is formed over a blue emission layer. The blue emission layer is formed over an InGaN compliance layer.

The green emission layers comprise multiple quantum well (MOW) structures which can emit green light with wavelengths ranging from 500 nm to 550 nm. In this MOW structure, a 3 nm thick of In 0.25 Ga 0.75 N layer serves as an active layer and it is sandwiched by two GaN (9 nm) barrier layers to form one set of quantum well (MQW). The green emission layers can contain one to three sets of quantum wells to form MOW structures.

The blue emission layers comprise multiple quantum well (MQW) structures which can emit blue light with wavelengths ranging from 450 nm to 470 nm. In this MQW structure, a 3 nm thick of In 0.15 Ga 0.85 N layer serves as an active layer and it is sandwiched by two GaN (9 nm) barrier layers to form one set of quantum well (OW). The blue emission layers can contain two to ten sets of quantum wells to form blue MOW structures.

Figure 1:
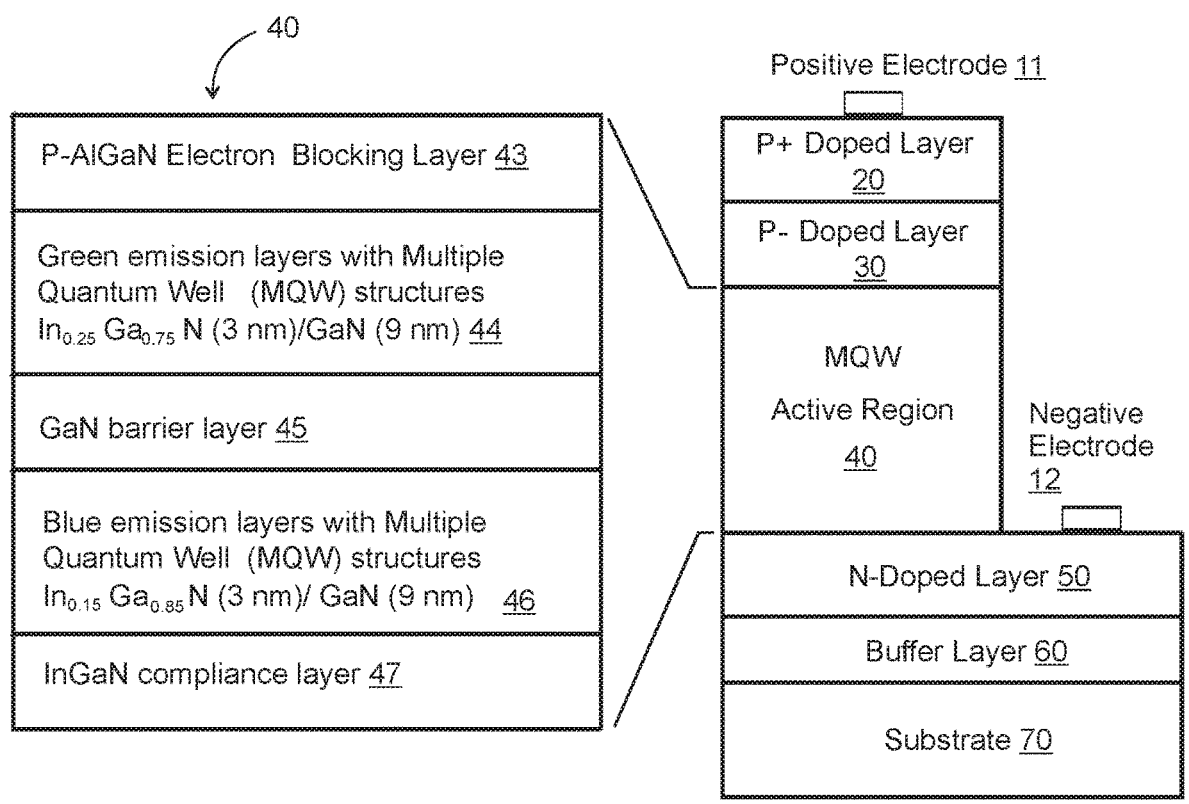
FIG. 1 is a diagram of a monolithic dual-color blue green LED.

The following call out list of elements can be a useful guide in referencing the element numbers of the drawings.
11 first positive electrodes
12 negative electrode 13 second positive electrode
14 red luminescence layer
15 red luminescence materials
16 first subpixel
17 second subpixel
18 first positive electrode rail
19 second positive electrode rail
20 P+ doped layer
21 first P+ doped layer
22 second P+ doped layer
23 green and/or blue emissions
24 red emissions
25 green emission at 40 mA
26 blue emission at 360 mA
30 P− doped layer
31 first P− doped layer
32 second P− doped layer
40 MQW active region
41 first dual color blue green MQW active region
42 second dual color blue green MQW active region
43 P-AlGaN electron blocking layer
44 green emission layer
45 GaN barrier layer
46 blue emission layer
47 InGaN compliance layer
50 N-doped layer
60 buffer layer
70 substrate

DETAILED DESCRIPTION OF THE PREFERRED EMBODIMENT

Glossary

LED stands for light-emitting diode
MQW stands for multiple quantum well
P+ doped layer stands for a positive charged doped layer
N-doped layer stands for negative charged doped layer
InGaN stands for indium gallium nitride
GaN stands for gallium nitride
AlGaN stands for aluminum gallium nitride
mA stands for milliamp As seen in FIG. 1, a first positive electrode 11 is formed on a P+ doped layer 20. The P+ doped layer 20 is formed on a P− doped layer 30. The P− doped layer 30 is formed on a multiple quantum well (MQW) active region 40. The multiple quantum well active region is formed on an N-doped layer 50, The N-doped layer 50 is formed on a buffer layer 60. A negative electrode 12 is formed on the N-doped layer 50. The buffer layer 60 is formed on a substrate 70.

The MQW active region 40 is between the P− doped layer 30 and the N-doped layer 50. The MQW active region 40 has a P-AlGaN electron blocking layer 43 formed over green emission layer 44. The green emission layers have multiple quantum well (MQW) structures with In 0.25 Ga 0.75 N (3 nm)/GaN (9 nm). The green emission layer 44 can be formed in sub layers.

The green emission layers consist of a 3 nm thick of In 0.25 Ga 0.75 N active layer and two GaN (9 nm) barrier layers to form one set of quantum well (QW). The green emission layers can contain one to three sets of quantum wells to form MQW structures.

The green emission layers 44 are formed over the GaN barrier layer 45, and the GaN barrier layer 45 is formed over the blue emission layers 46. The blue emission layers 46 have multiple quantum well (MQW) structures formed with In 0.15 Ga 0.85 N (3 nm)/GaN (9 nm).

The blue emission layers 46 are preferably made with multiple quantum well (MQW) structures, especially In 0.15 Ga 0.85 N (3 nm)/GaN (9 nm). The blue emission layers 46 are formed on an InGaN compliance layer 47. The blue emission layers consist of a 3 nm thick of In 0.15 Ga 0.85 N active layer and two GaN (9 nm) barrier layers to form one set of quantum well (QW). The blue emission layers can contain two to ten sets of quantum wells to form MQW structures.

Figure 2:
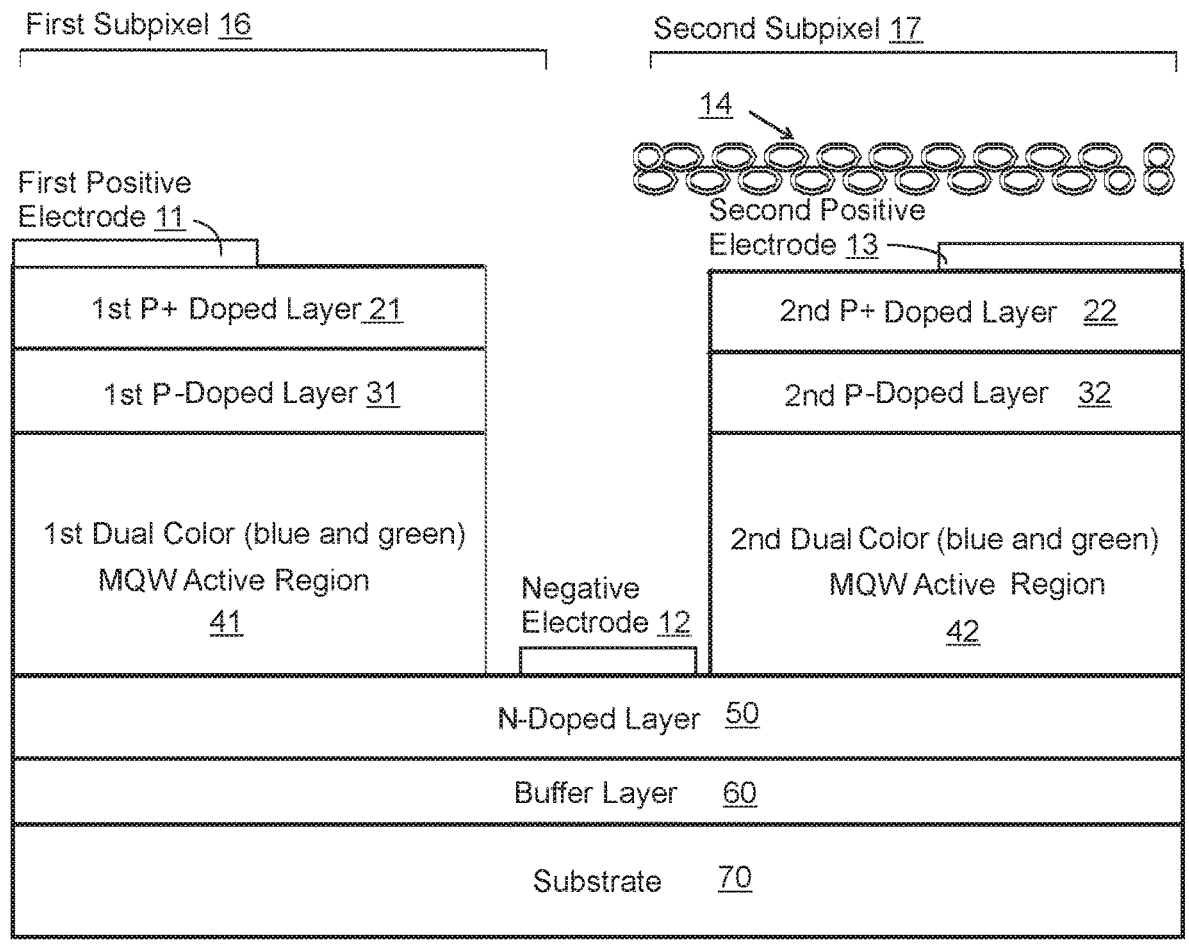
FIG. 2 is a sectional view illustrating an LED according to an exemplary embodiment of the present invention.

As seen in FIG. 2, the first subpixel 16 and the second subpixel 17 are formed on a single substrate 70 adjacent to each other. A first positive electrode 11 is formed adjacent to a second positive electrode 13 with a negative electrode 12 between the first positive electrode 11 and the second positive electrode 13.

The first positive electrode is formed on a first P+ doped layer 21. The first P+ doped layer 21 is formed on a first P− doped layer 31, which is formed on the first dual color (blue/green) MQW active region 41. A power controller can output power to the positive electrode or the negative electrode. During the manufacture process, a light sensor sensing the red, green and blue output can provide a feedback control to the power controller that controls the output to the first positive electrode 11 or the second positive electrode 13. Therefore, the desired light color (blue, green, red or their mixtures) and intensity can be achieved accordingly.

The red luminescence layer 14 is mounted above the second P+ doped layer 22, which is formed on the second P− doped layer 32. The second P− doped layer 32 is formed on the second dual color blue green MQW active region 42. The negative electrode 12, first dual color blue green MQW active region 41 and the second dual color blue green MQW active region 42 are formed on the N-doped layer 50 which in turn is formed on the buffer layer 60 which in turn is formed on the substrate 70.

Figure 3:
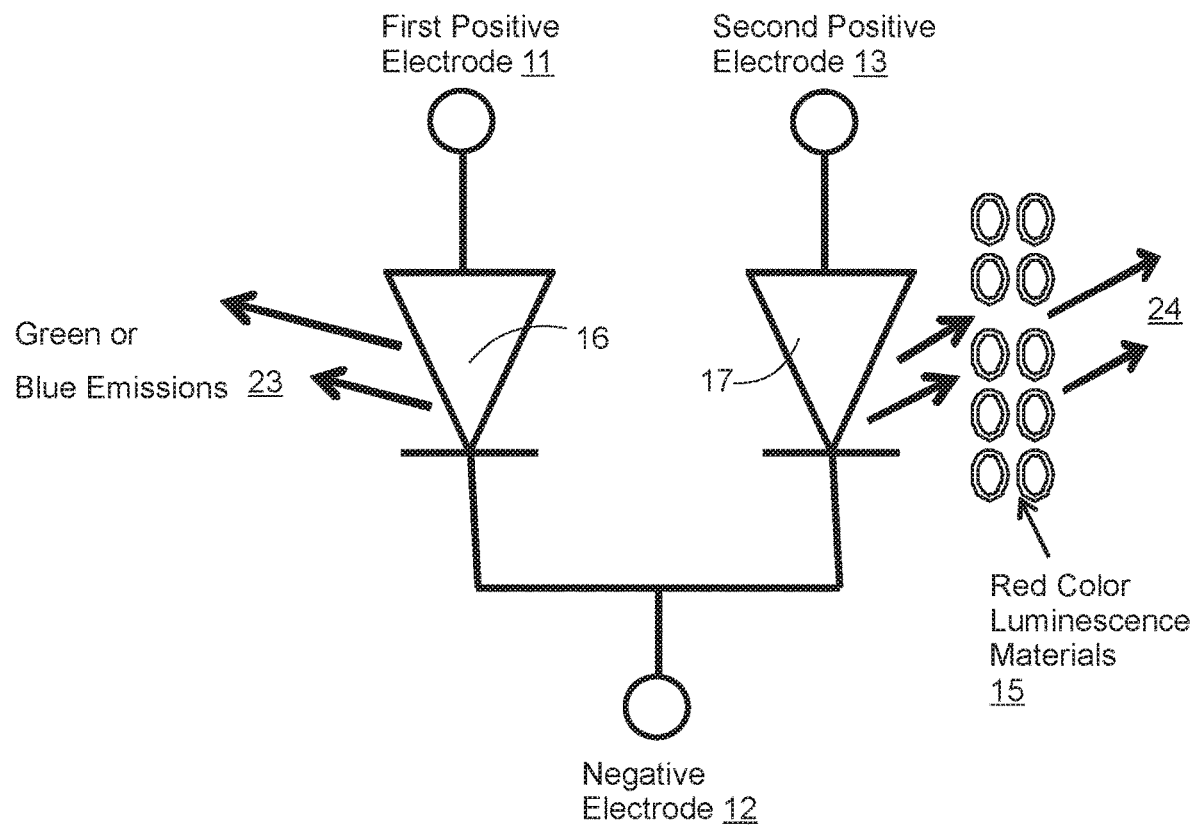
FIG. 3 is a circuit diagram showing the dual-mode operation of the present invention.

As seen in FIG. 3, the first positive electrode 11 and the second positive electrode 13 are connected to different light emitting diodes. The first positive electrode 11 is connected to the first subpixel 16, and the second positive electrode 13 is connected to the second subpixel 17. The first subpixel 16 and the second subpixel 17 are both light-emitting diodes. The first subpixel 16 can output a green or blue emissions 23 depending upon voltage or current. The second subpixel 17 outputs a light that passes through red color luminescence materials 15 which create red emissions 24. When the red emissions 24 are mixed with green or blue emissions 23, the pair of light-emitting diodes provides a full spectrum light-emitting diode. The first subpixel 16 is a light-emitting diode connected between the first positive electrode 11 and the negative electrode 12. The second subpixel 17 is a red light emitting diode connected between the second positive electrode 13 and the negative electrode 12.

Figure 4:
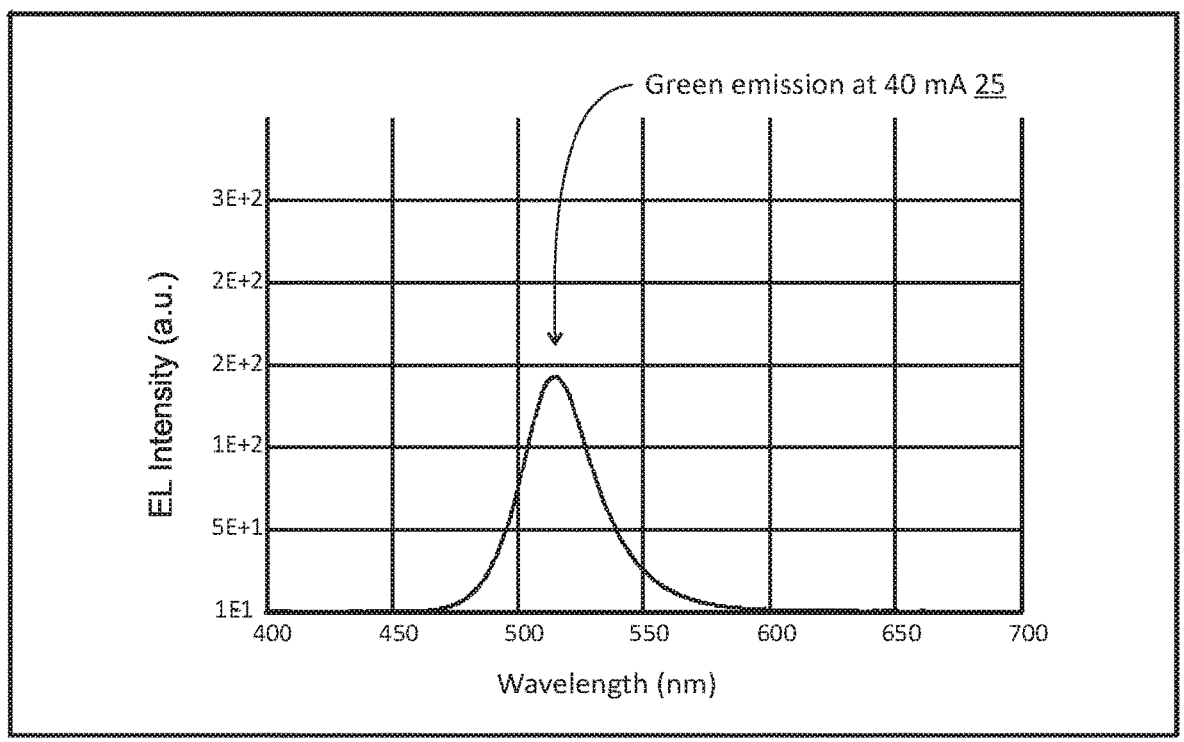
FIG. 4 is a chart showing green light emissions.
Figure 5:
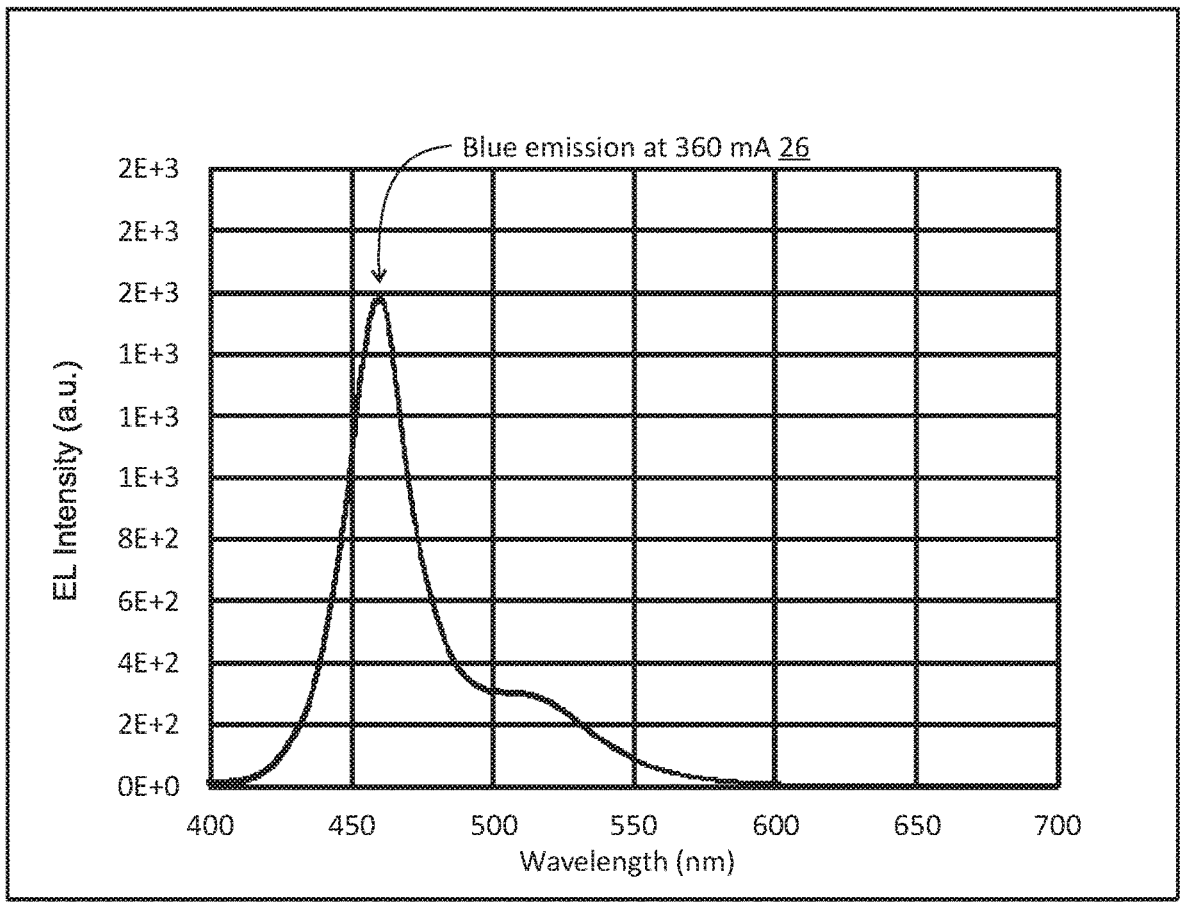
FIG. 5 is a chart showing blue light emissions.

As seen in FIG. 4, the first subpixel 16 can have green emissions 25 with a peak between 500 nm and 550 nm are output at ~40 mA of current. As seen in FIG. 5, the first subpixel 16 blue emissions with a peak between 450 nm and 475 nm are output at ~360 mA. Therefore, varying the current on the first subpixel 16 changes the wavelength of the light output.

The device can operate in red, green and blue modes. For example, in a green mode, the first positive electrode receives 40 mA to output green light emissions 25 from the first subpixel 16. In the blue mode, the first positive electrode receives 360 mA to output blue light emissions 25 from the first subpixel 16. In the red mode, the positive electrode receives the current which outputs a light that is filtered to become red light.

The LED chip in totality is configured to independently and selectively device can independently emit three primary colors and their mixtures within one single chip, and wherein the chip size ranges can be from as small as one micrometer square to as large as a 100 millimeter square area.

Figure 6:
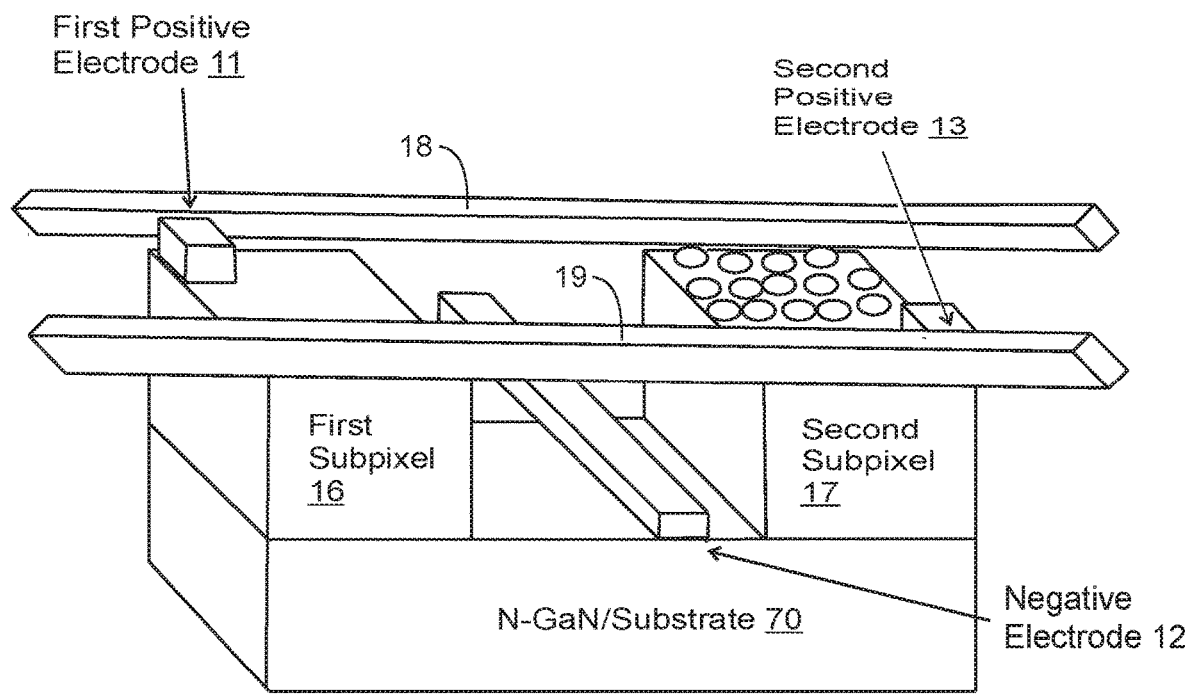
FIG. 6 is a chart showing the three-dimensional layout architecture for the LED chip.

As seen in FIG. 6, the first positive electrode 11 can be formed on a first positive electrode rail 18, and the second positive electrode 13 can be formed on a second positive electrode rail 19. The first positive electrode rail 18 and the second positive electrode rail 19 are mounted over the first subpixel 16 and the second subpixel 17. The rail structure can be made of an elongated electrically conductive substance such as a metal capable of carrying an electron flow. The negative electrode 12 can also be formed as a rail and mounted over the substrate 70. The substrate 70 can be made of gallium nitride such as N-GaN.

The invention claimed is:

1. A light-emitting diode (LED), comprising:
   a. a substrate, wherein the substrate is formed as a substrate layer;
   b. a buffer layer, wherein the buffer layer is formed on the substrate layer;
   c. an N– doped layer, wherein the N– doped layer is formed on the buffer layer;
   d. a first dual color blue green MQW active region formed on the N– doped layer;
   e. a second dual color blue green MQW active region formed on the N– doped layer;
   f. a negative electrode, wherein the negative electrode is formed on the N– doped layer;
   g. a first P– doped layer, wherein the first P– doped layer is formed on the first dual color blue green MQW active region;
   h. a second P– doped layer, wherein the second P– doped layer is formed on the second dual color blue green MQW active region;
   i. a first P+ doped layer, wherein the first P+ doped layer is formed on the first P– doped layer;
   j. a second P+ doped layer, wherein the second P+ doped layer is formed on the second P– doped layer;
   k. a first positive electrode, wherein the first positive electrode is formed on the first P+ doped layer;
   l. a second positive electrode, wherein the second positive electrode is formed on the second P+ doped layer; and
   m. a red luminescence layer, wherein the red luminescence layer is mounted over the second P+ doped layer.

2. The light-emitting diode (LED), of claim 1, wherein the first dual color blue/green MQW active region is configured to output a blue emission having a peak wavelength between 450 nm and 475 nm when the first positive electrode has a current flow of ~360 mA.

3. The light-emitting diode (LED), of claim 1, wherein the first dual color blue green MQW active region is configured to output a green emission having a peak wavelength between 500 nm and 550 nm when the first positive electrode has a current flow of 40 mA.

4. The light-emitting diode (LED), of claim 1, wherein the first dual color blue/green MQW active region is formed of a laminated structure comprising a P-AlGaN electron blocking layer formed over a green emission layer, wherein the green emission layer is formed over a GaN barrier layer, wherein the GaN barrier layer is formed over a blue emission layer, wherein the blue emission layer is formed over an InGaN compliance layer.

5. The light-emitting diode (LED), of claim 4, wherein the green emission layers comprise multiple quantum well (MQW) structures with In 0.25 Ga 0.75 N (3 nm)/GaN (9 nm) structures, wherein the green emission layer has green emission sublayers.

6. The light-emitting diode (LED), of claim 4, wherein the blue emission layers comprise multiple quantum well (MQW) structures with In 0.15 Ga 0.85 N (3 nm)/GaN (9 nm) structures, wherein the blue emission layer has blue emission sublayers.

7. The light-emitting diode (LED), of claim 5, wherein the light-emitting diode is configured to independently and selectively emit three primary colors and their mixtures within one single chip, and wherein the chip size ranges from as small as one micrometer square to as large as 100 millimeter square.

8. The light-emitting diode (LED), of claim 6, wherein the green emission layers comprise multiple quantum well (MQW) structures with In 0.25 Ga 0.75 N (3 nm)/GaN (9 nm) structures, wherein the green emission layer has green emission sublayers.

9. The light-emitting diode (LED), of claim 8, wherein the blue emission layers comprise multiple quantum well (MQW) structures with In 0.15 Ga 0.85 N (3 nm)/GaN (9 nm) structures, wherein the blue emission layer has blue emission sublayers.

10. A light-emitting diode (LED); comprising:
    a. a substrate, wherein the substrate is formed as a substrate layer;
    b. a buffer layer, wherein the buffer layer is formed on the substrate layer;
    c. an N– doped layer, wherein the N– doped layer is formed on the buffer layer;
    d. a first dual color blue green MQW active region formed on the N– doped layer;
    e. a second MQW active region formed on the N– doped layer;
    f. a negative electrode, wherein the negative electrode is formed on the N– doped layer;
    g. a first P– doped layer, wherein the first P– doped layer is formed on the first dual color blue green MQW active region;
    h. a second P– doped layer, wherein the second P– doped layer is formed on the second MQW active region;
    i. a first P+ doped layer, wherein the first P+ doped layer is formed on the first P+ doped layer;
    j. a second P+ doped layer, wherein the second P+ doped layer is formed on the second P– doped layer;
    k. a first positive electrode, wherein the first positive electrode is formed on the first P+ doped layer;
    l. a second positive electrode, wherein the second positive electrode is formed on the second P+ doped layer; and
    m. a red luminescence layer, wherein the red luminescence layer is mounted over the second P+ doped layer.

11. The light-emitting diode (LED), of claim 10, wherein the first dual color blue/green MQW active region is configured to output a blue emission having a peak wavelength between 450 nm and 475 nm when the first positive electrode has a current flow of ~360 mA.

12. The light-emitting diode (LED), of claim 10, wherein the first dual color blue green MQW active region is configured to output a green emission having a peak wavelength between 500 nm and 550 nm when the first positive electrode has a current flow of 40 mA.

13. The light-emitting diode (LED), of claim 10, wherein the first dual color blue/green MQW active region is formed of a laminated structure comprising a P-AlGaN electron blocking layer formed over a green emission layer, wherein the green emission layer is formed over a GaN barrier layer, wherein the GaN barrier layer is formed over a blue emission layer, wherein the blue emission layer is formed over an InGaN compliance layer 47.

14. The light-emitting diode (LED), of claim 13, wherein the green emission layers comprise multiple quantum well (MQW) structures with In 0.25 Ga 0.75 N (3 nm)/GaN (9 nm) structures, wherein the green emission layer has green emission sublayers.

15. The light-emitting diode (LED), of claim 13, wherein the blue emission layers comprise multiple quantum well (MQW) structures with In 0.15 Ga 0.85 N (3 nm)/GaN (9 nm) structures, wherein the blue emission layer has blue emission sublayers.

16. The light-emitting diode (LED), of claim 13, wherein the light-emitting diode is configured to independently and selectively emit three primary colors and their mixtures within one single chip, and wherein the chip size ranges from as small as one micrometer square to as large as 100 millimeter square.

17. The light-emitting diode (LED), of claim 16, wherein the green emission layers comprise multiple quantum well (MQW) structures with In 0.25 Ga 0.75 N (3 nm)/GaN (9 nm) structures, wherein the green emission layer has green emission sublayers.

18. The light-emitting diode (LED), of claim 16, wherein the blue emission layers comprise multiple quantum well (MQW) structures with In 0.15 Ga 0.85 N (3 nm)/GaN (9 nm) structures, wherein the blue emission layer has blue emission sublayers.

\* \* \* \* \*